(12) United States Patent
Kuchibhatla et al.

(10) Patent No.: US 10,946,808 B2
(45) Date of Patent: Mar. 16, 2021

(54) DISPLAY SCREEN MOUNTING ASSEMBLY

(71) Applicant: Ford Global Technologies, LLC, Dearborn, MI (US)

(72) Inventors: Sreenivas Kuchibhatla, Canton, MI (US); Kalyanaraman Bharathan, Canton, MI (US); Tim R. Beard, St. Clair Shores, MI (US); Julian Garby, II, Canton, MI (US); Dan G. Busuioc, Dearborn, MI (US); David Warren Wilson, Livonia, MI (US)

(73) Assignee: Ford Global Technologies, LLC, Dearborn, MI (US)

( * ) Notice: Subject to any disclaimer, the term of this patent is extended or adjusted under 35 U.S.C. 154(b) by 17 days.

(21) Appl. No.: 16/275,870

(22) Filed: Feb. 14, 2019

(65) Prior Publication Data

US 2020/0262357 A1   Aug. 20, 2020

(51) Int. Cl.
| | |
|---|---|
| *B60R 11/00* | (2006.01) |
| *B60R 11/02* | (2006.01) |
| *H05K 5/00* | (2006.01) |
| *H05K 5/02* | (2006.01) |

(52) U.S. Cl.
CPC ........ *B60R 11/0235* (2013.01); *H05K 5/0017* (2013.01); *H05K 5/0204* (2013.01); *B60R 2011/0005* (2013.01); *B60R 2011/0045* (2013.01)

(58) Field of Classification Search
CPC ............ B60R 11/0258; B60R 11/0264; B60R 11/0229; B60R 11/0235; B60R 2011/0005; B60R 2011/0045
USPC ............ 296/193.02, 24.3, 24.39, 70, 72, 73
See application file for complete search history.

(56) References Cited

U.S. PATENT DOCUMENTS

| | | | |
|---|---|---|---|
| 6,398,259 B1 | 6/2002 | Palmer et al. | |
| 9,022,450 B1 | 5/2015 | Eberlein et al. | |
| 10,525,899 B2* | 1/2020 | Mullen | ................. F16F 1/3732 |
| 2003/0146640 A1* | 8/2003 | Nakajima | .............. B60K 37/02 296/70 |
| 2007/0290519 A1* | 12/2007 | Gunther | ............. G02B 27/0149 296/70 |
| 2008/0029669 A1 | 2/2008 | Olah et al. | |
| 2009/0161302 A1 | 6/2009 | Ferren et al. | |
| 2009/0284038 A1* | 11/2009 | Sato | ....................... B60K 37/00 296/72 |
| 2017/0282812 A1* | 10/2017 | Yoshimura | ........... H05K 5/0017 |

* cited by examiner

*Primary Examiner* — Dennis H Pedder
(74) *Attorney, Agent, or Firm* — David Coppiellie; Price Heneveld LLP

(57) ABSTRACT

A vehicle instrument panel assembly includes a display screen positioned within a housing, wherein the housing includes first and second protrusions. The vehicle instrument panel assembly includes a cross-car beam and a first bracket coupled to the cross-car beam. A second bracket is coupled to the first bracket and the first and second protrusions.

18 Claims, 6 Drawing Sheets

DISPLAY SCREEN MOUNTING ASSEMBLY

FIELD OF THE DISCLOSURE

The present disclosure generally relates to a mounting assembly. More specifically, the present disclosure relates to a vehicle display screen mounting assembly.

BACKGROUND OF THE DISCLOSURE

Vehicle displays may be subject to various types of load conditions, including, for example, dynamic events. It may therefore be advantageous to include a mounting assembly that reduces the load operating on the display screen.

SUMMARY OF THE DISCLOSURE

According to at least one aspect of the present disclosure, a vehicle instrument panel assembly includes a display screen positioned within a housing, wherein the housing includes first and second protrusions. The vehicle instrument panel assembly includes a cross-car beam and a first bracket coupled to the cross-car beam. A second bracket is coupled to the first bracket and the first and second protrusions.

According to another aspect of the present disclosure, a display screen mounting assembly for a vehicle includes a display screen within a housing, wherein the housing includes first and second protrusions. A first bracket is coupled to top surfaces of the first and second protrusions. A second bracket is coupled to bottom surfaces of the first and second protrusions and a lower surface of the first bracket.

According to another aspect of the present disclosure, a display screen mounting assembly for a vehicle includes a display screen positioned within a housing, wherein the housing includes first and second protrusions. A first bracket has left and right first bracket members. The left and right first bracket members are configured to be coupled to a cross-car beam. A second bracket is coupled to the first bracket and the first and second protrusions.

These and other aspects, objects, and features of the present disclosure will be understood and appreciated by those skilled in the art upon studying the following specification, claims, and appended drawings.

BRIEF DESCRIPTION OF THE DRAWINGS

The following is a description of the figures in the accompanying drawings. The figures are not necessarily to scale, and certain features and certain views of the figures may be shown exaggerated in scale or in schematic in the interest of clarity and conciseness.

In the drawings.

DETAILED DESCRIPTION OF THE PREFERRED EMBODIMENTS

Additional features and advantages of the invention will be set forth in the detailed description which follows and will be apparent to those skilled in the art from the description, or recognized by practicing the invention as described in the following description, together with the claims and appended drawings.

Figure 1:
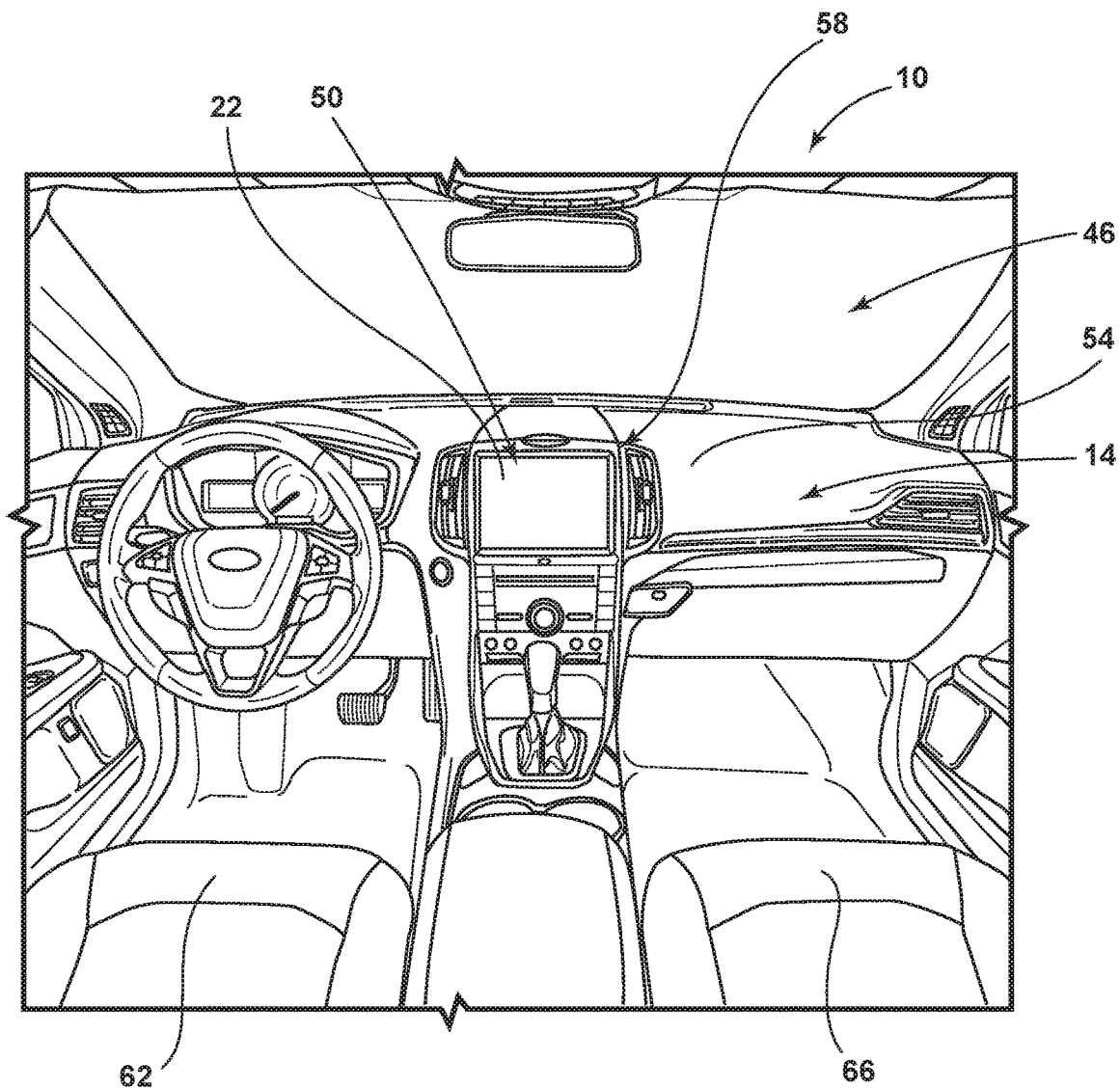
FIG. 1 is a front perspective view of an instrument panel assembly within a passenger area of a vehicle, according to one example.

For purposes of description herein, the terms "upper," "lower," "right," "left," "rear," "front," "vertical," "horizontal," and derivatives thereof shall relate to the concepts as oriented in FIG. 1. However, it is to be understood that the concepts may assume various alternative orientations, except where expressly specified to the contrary. It is also to be understood that the specific devices and processes illustrated in the attached drawings, and described in the following specification are simply exemplary embodiments of the inventive concepts defined in the appended claims. Hence, specific dimensions and other physical characteristics relating to the embodiments disclosed herein are not to be considered as limiting, unless the claims expressly state otherwise.

As used herein, the term "and/or," when used in a list of two or more items, means that any one of the listed items can be employed by itself, or any combination of two or more of the listed items, can be employed. For example, if a composition is described as containing components A, B, and/or C, the composition can contain A alone; B alone; C alone; A and B in combination; A and C in combination; B and C in combination; or A, B, and C in combination.

As used herein, the term "about" means that amounts, sizes, formulations, parameters, and other quantities and characteristics are not and need not be exact, but may be approximate and/or larger or smaller, as desired, reflecting tolerances, conversion factors, rounding off, measurement error and the like, and other factors known to those of skill in the art. When the term "about" is used in describing a value or an end-point of a range, the disclosure should be understood to include the specific value or end-point referred to. Whether or not a numerical value or end-point of a range in the specification recites "about," the numerical value or end-point of a range is intended to include two embodiments: one modified by "about," and one not modified by "about." It will be further understood that the end-points of each of the ranges are significant both in relation to the other end-point, and independently of the other end-point.

The terms "substantial," "substantially," and variations thereof as used herein are intended to note that a described feature is equal or approximately equal to a value or description. For example, a "substantially planar" surface is intended to denote a surface that is planar or approximately planar. Moreover, "substantially" is intended to denote that two values are equal or approximately equal. In some embodiments, "substantially" may denote values within about 10% of each other, such as within about 5% of each other, or within about 2% of each other.

As used herein the terms "the," "a," or "an," mean "at least one," and should not be limited to "only one" unless explicitly indicated to the contrary. Thus, for example, reference to "a component" includes embodiments having two or more such components unless the context clearly indicates otherwise.

In this document, relational terms, such as first and second, top and bottom, and the like, are used solely to distinguish one entity or action from another entity or action, without necessarily requiring or implying any actual such relationship or order between such entities or actions. The terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus. An element proceeded by "comprises . . . a" does not, without more constraints, preclude the existence of additional identical elements in the process, method, article, or apparatus that comprises the element.

Referring to FIGS. 1-9, reference numeral 10 generally designates a vehicle, including a vehicle instrument panel assembly 14. A cross-car beam 18 extends in a latitudinal-orientation across the vehicle 10. A display screen 22 is positioned within a housing 26 that includes first and second protrusions 30, 34. A first bracket 38 is coupled to the cross-car beam 18. A second bracket 42 is coupled to the first bracket 38 and coupled to the first and second protrusions 30, 34 of the housing 26.

Referring to FIG. 1, a passenger area 46 of the vehicle 10 includes the vehicle instrument panel assembly 14, and further includes a display screen mounting assembly 50. The display screen 22 may be coupled to a trim piece 54 within the passenger area 46 via the display screen mounting assembly 50. As depicted, the display screen 22 may form an integrated uniform surface with the surrounding trim piece 54. Accordingly, the trim piece 54 may surround a perimeter of the display screen 22. The display screen 22 is positioned within a center stack portion 58 of the vehicle instrument panel assembly 14, such that the display screen 22 is accessible by occupants positioned within a driver seat 62 and an adjacent passenger seat 66. The display screen 22 may be, for example, used as a navigation unit, a control system for the vehicle 10, a user interface, or provide other electronic functions for the vehicle 10. The display screen 22 may serve as an output display and may be a touchscreen that receives touch in parts.

Figure 2:
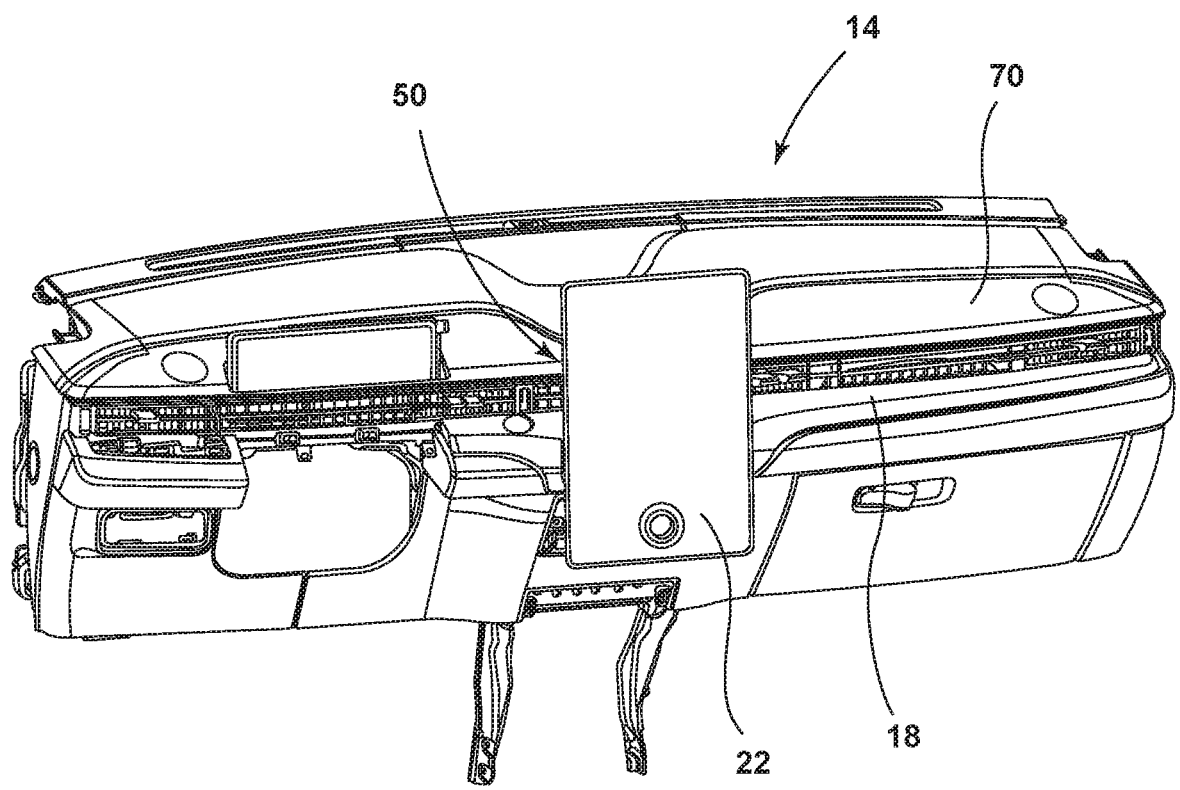
FIG. 2 is a front perspective view of the instrument panel assembly, according to one example.

Referring to FIG. 2, the cross-car beam 18 extends across the vehicle instrument panel assembly 14 in a latitudinal-oriented direction. The cross-car beam 18 is configured to operate as a frame of vehicle instrument panel assembly 14. The cross-car beam 18 may be formed from, for example, steel, magnesium, aluminum, or a combination thereof. A carrier 70 is coupled to the cross-car beam 18. The carrier 70 may be, for example, a plastic substrate. The trim piece 54 (FIG. 1) may be coupled to the carrier 70. The display screen 22, as depicted, is spaced apart from the cross-car beam 18 and the carrier 70. The display screen 22 may be subject to various types of loads, such as, for example, tactile, push, pull, and/or abuse loads. The display screen mounting assembly 50 may be advantageous to support the display screen 22 while allowing the display screen 22 to stroke, thereby reducing the load from a dynamic event.

Figure 3:
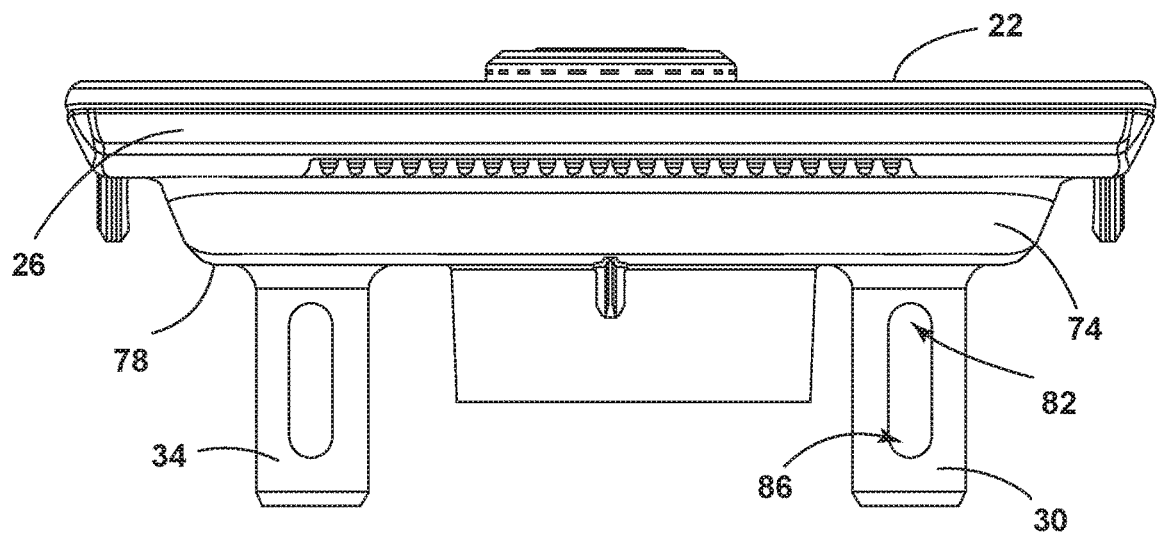
FIG. 3 is a top view of a housing of a display screen having first and second protrusions, according to one example.

Referring to FIG. 3, the display screen 22 is positioned in the housing 26. The housing 26 may support display screens 22 having a diagonal measurement in a range of from about 10 inches to about 20 inches, according to one example. It is contemplated that the housing 26, and therefore the display screen mounting assembly 50 may accommodate any sized display screen 22. The housing 26 may be formed from, for example, metals, plastics, or combinations thereof. In various examples, the housing 26 may include a backing plate 74. The backing plate 74 may be, for example, magnesium and formed from a high pressure die casting process. The housing 26, as illustrated, includes the first and second protrusions 30, 34 extending from a back surface 78 of the housing 26. It is contemplated that the first and second protrusions 30, 34 may extend from the backing plate 74. The first and second protrusions 30, 34 are illustrated as left and right protrusions but may be configured as upper and lower protrusions. The first and second protrusions 30, 34 define elongated apertures 82 in center portions 86 of the first and second protrusions 30, 34, respectively. The elongated apertures 82 may have a width of approximately 10 mm and a length of approximately 35 mm, according to a specific example. It is also contemplated the elongated apertures may have a width in a range of from about 5 mm to about 15 mm and a length in a range of about 30 mm to about 40 mm, according to one example. The elongated apertures 82 may be advantageous in facilitating the stroking of the display screen 22.

Figure 4:
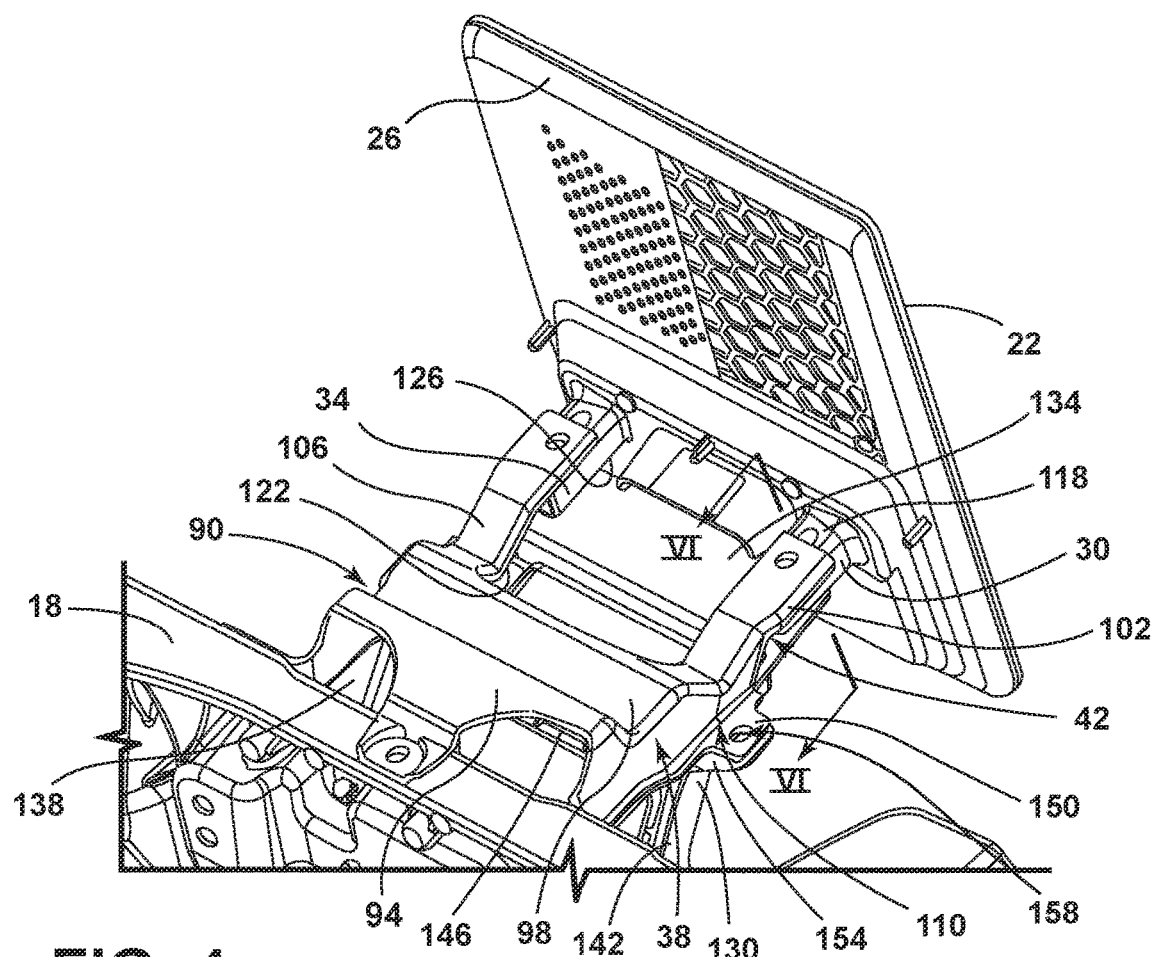
FIG. 4 is a side perspective view of a display screen mounting assembly, according to one example.

Referring now to FIG. 4, the display screen 22 is coupled to the cross-car beam 18 via the first and second brackets 38, 42. The first bracket 38 includes a body 90 having a body upper portion 94 and a body lower portion 98. The first bracket 38 includes left and right elongated supports 102, 106 extending from the body lower portion 98. As illustrated, the left and right elongated supports 102, 106 include v-shaped portions 110 extending into horizontal portions 114, respectively. The horizontal portions 114 of the left and right elongated supports 102, 106 may cooperate with top surfaces 118 of the first and second protrusions 30, 34 of the housing 26. In other words, the first bracket 38 includes the left and right elongated supports 102, 106, which are configured to abut the top surfaces 118 of the first and second protrusions 30, 34, respectively.

In various examples, as depicted in FIG. 4, the display screen 22 is also coupled to the cross-car beam 18 via the second bracket 42. Accordingly, both the first and second brackets 38, 42 may be coupled to the cross-car beam 18 and the housing 26. The second bracket 42 is coupled to the first and second protrusions 30, 34 and the first bracket 38. In other words, the second bracket 42 is coupled to a lower surface 122 of the first bracket 38 and bottom surfaces 126 of the first and second protrusions 30, 34. The second bracket 42 may include an angled support 130 and a horizontal support 134. The angled support 130 may include a left angled support portion 138 and a right angled support portion 142 coupled via a linking portion 146. The linking portion 146 may be spaced apart from the horizontal support 134. The angled support 130 is coupled to the cross-car beam 18 and the horizontal support 134 abuts the bottom surfaces 126 of the first and second protrusions 30, 34. The horizontal support 134 may form a continuous surface between the first and second protrusions 30, 34. It is contemplated that the horizontal support 134 may include left and right projections configured to abut the first and second protrusions 30, 34 such that there is not a continuous surface between the first and second protrusions 30, 34. The second bracket 42 may be formed from, for example, plastics and fiber-reinforced plastics (e.g., glass or carbon fiber). Additionally, the second bracket 42 have a thickness in a range of from about 2.5 mm to about 4 mm, according to one example.

Referring still to FIG. 4, the second bracket 42 abuts the lower surface 122 of the first bracket 38. The first bracket 38 may include upper connection tabs 150 extending from the v-shaped portions 110 of the left and right elongated supports 102, 106. The second bracket 42 may include lower connection tabs 154 configured to abut the upper connection tabs 150. The upper and lower connection tabs 150, 154 may each define mounting holes 158 configured to receive a fastener 162 (FIG. 6) to couple the second bracket 42 to the first bracket 38. It is contemplated that the upper and lower connection tabs 150, 154 may be coupled via snap features or other integrally defined coupling features.

Figure 5:
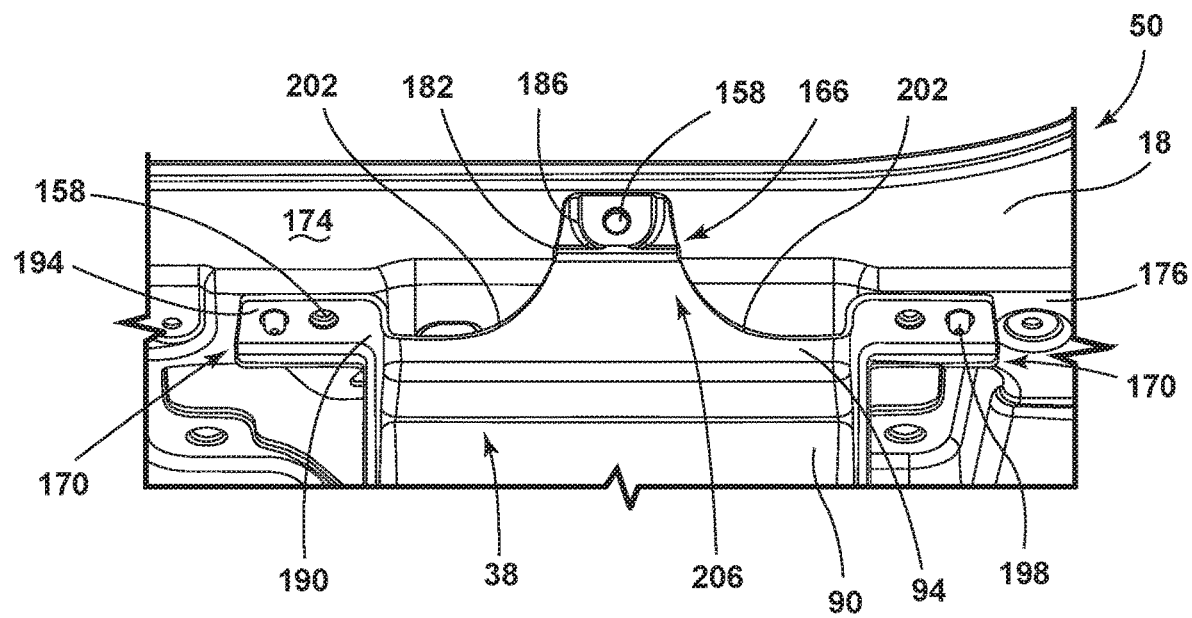
FIG. 5 is a top view of a first bracket of the display screen mounting assembly coupled to cross-car beam, according to one example.
Figure 6:
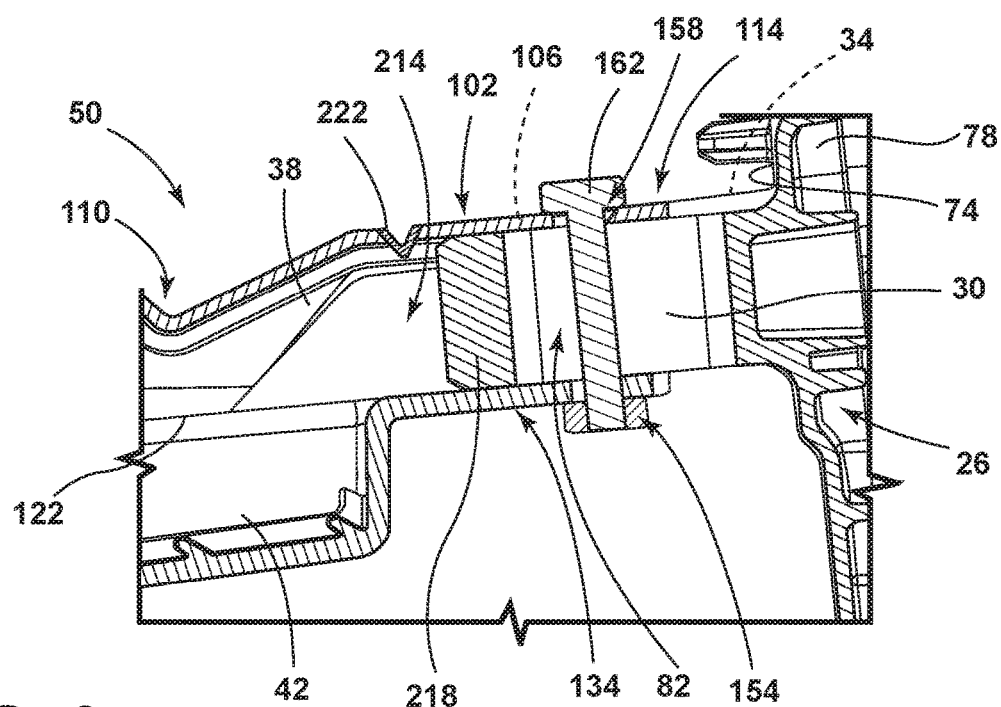
FIG. 6 is a partial cross sectional view taken along line VI-VI of FIG. 4 of the first bracket and a second bracket coupled to the housing of the display screen, according to one example.

Referring to FIGS. 4 and 5, the first bracket 38 is coupled to the cross-car beam 18 via a center attachment tab 166 and lateral attachment tabs 170. The lateral attachment tabs 170 extend from opposing side portions of the body 90 of the first bracket 38. The center attachment tab 166 is configured to couple to an upper surface 174 of the cross-car beam 18. Further, the lateral attachment tabs 170 are configured to couple to a side surface 176 of the cross-car beam 18 which may be, for example, a vehicle-rearward surface. The center and lateral attachment tabs 166, 170 extend from the body upper portion 94 of the body 90 of the first bracket 38 in a vehicle-forward direction. Each of the center and lateral attachment tabs 166, 170 may define an L-shaped extension such that the body upper portion 94 is spaced apart from the cross-car beam 18. Accordingly, the center attachment tab 166 includes a center tab extension portion 182 that extends vertically downwards from the body upper portion 94 at an angle in a range of from about 45° to about 90°. A center tab abutment portion 186 extends from the center tab extension portion 182 at an angle in a range of about 45° to about 90°. The center tab abutment portion 186 may abut the upper surface 174 of the cross-car beam 18 and may define a mounting hole 158 for receiving the fastener 162 (FIG. 6). Further, the lateral attachment tabs 170 include lateral tab extension portions 190 and lateral tab abutment portions 194, respectively. The lateral tab extension portions 190 extend from the body upper portion 94 of the first bracket 38 towards the cross-car beam 18 at an angle in a range of about 45° to about 90°. Lateral tab abutment portions 194 extend at an angle in a range of about 45° to about 90° from the lateral tab extension portions 190. The lateral tab abutment portions 194 extend outward from the first bracket 38 and define mounting holes 158 for receiving the fasteners 162. The lateral tab abutment portions 194 may each define more than one mounting hole 158. One mounting hole 158 defined by each of the lateral tab abutment portions 194 may be configured to receive a locating protuberance 198 extending from the cross-car beam 18. As illustrated, the outer positioned mounting hole 158 receives the locating protuberance 198 and the inner positioned mounting hole 158 is configured to receive the fastener 162 for coupling the first bracket 38 to the cross-car beam 18. The locating protuberance 198 may be advantageous for coupling and/or retaining the first bracket 38 in the desired location on the cross-car beam 18.

Referring to FIG. 5, the body upper portion 94 of the first bracket 38 defines arced edges 202 between the center attachment tab 166 and each of the lateral attachment tabs 170. In various examples, each of the arced edges 202 extends from the center tab extension portion 182 of the center attachment tab 166 to the lateral tab extension portions 190 of the lateral attachment tabs 170. The arced edges 202 form a substantially concave shape in a vehicle-forward portion 206 (e.g., proximate the cross-car beam 18) of the body upper portion 94. In various examples, the arced edges 202 may have a length in a range of about 180 mm to about 220 mm, according to a specific example. The arced edges 202 may be advantageous for allowing the first bracket 38 to bend and/or deform in response to different loading conditions operating on the first bracket 38 and/or other components of the display screen mounting assembly 50. Further, the spacing between the center attachment tab 166 and each of the lateral attachment tabs 170 may be advantageous in increasing the ability of the first bracket 38 to bend and/or deform. In various examples, the first bracket 38 may be made from, for example, metals or metal alloys. For example, the first bracket 38 may be made from magnesium. Further, the first bracket 38 may have a thickness in a range of from about 1 mm to about 4 mm, according to one example.

Referring now to FIG. 6, the second bracket 42 may abut the lower surface 122 of the first bracket 38 proximate the v-shaped portions 110 of the left and right elongated supports 102, 106 of the first bracket 38. The v-shaped portions 110 may extend vertically upwards at an angle from the location where the first bracket 38 abuts the second bracket 42. The horizontal portions 114 of the first bracket 38 may be parallel to the horizontal supports 134 of the second bracket 42. The horizontal portions 114 and the horizontal supports 134, as illustrated, are spaced apart a sufficient distance to accommodate the first and second protrusions 30, 34 of the housing 26. The horizontal portions 114 are substantially flat and configured to abut the top surfaces 118 of the first and second protrusions 30, 34. The v-shaped portions 110 of each of the left and right elongated supports 102, 106 extends downwards from the horizontal support 134 at an angle in a range of from about 15° to about 45°. The v-shaped portions 110 of the left and right elongated supports 102, 106 cooperate with the horizontal support of the second bracket 42 to define a gap 214. The gap 214 may have a height in a range of from about 10 mm to about 20 mm, according to one example. The gap 214 may accommodate the first and second protrusions 30, 34. The gap 214 may be advantageous for accommodating the first and second protrusions 30, 34 if the display screen 22 strokes in response to a load operating on the display screen 22.

In various examples, the horizontal portions 114 of the left and right elongated supports 102, 106 first bracket 38 and the horizontal support 134 of the second bracket 42 may be spaced apart from the back surface 78 and/or backing plate 74 of the housing 26. The horizontal portion 114 and horizontal support 134 may also extend past end portions 218 of the first and second protrusions 30, 34, respectively. The horizontal portions 114 and the horizontal support 134 each define mounting holes 158 that are configured to vertically align with the elongated apertures 82 defined by the first and second protrusions 30, 34, respectively. The mounting holes 158 and the elongated apertures 82 receive the fastener 162 that retains the first and second brackets 38, 42 to the first and second protrusions 30, 34. The fasteners 162 may be, for example, pins, bolts, screws, or other mechanical fastening members. The fasteners 162 may be advantageous for providing a more convenient assembly of the display screen mounting assembly 50 compared to permanent attachment strategies (e.g., welding). In various examples, the fasteners 162 are configured to move in the fore-aft direction to facilitate the stroking of the display screen 22 (FIG. 1).

The horizontal portions 114 of the left and right elongated supports 102, 106 may have a length in a range of from about 40 mm to about 55 mm, according to one example. As illustrated, the horizontal portions 114 define v-shaped scores 222 proximate the v-shaped portions 110 of the left and right elongated supports 102, 106. The v-shaped scores 222 may be positioned away from the v-shaped portions 110 by a distance in a range of from about 5 mm to about 10 mm, according to a specific example. The v-shaped scores 222 may have a width and/or a depth in a range of from about 2 mm to about 10 mm, according to one example. The v-shaped scores 222 may be advantageous for energy management within the display screen mounting assembly 50.

Figure 7:
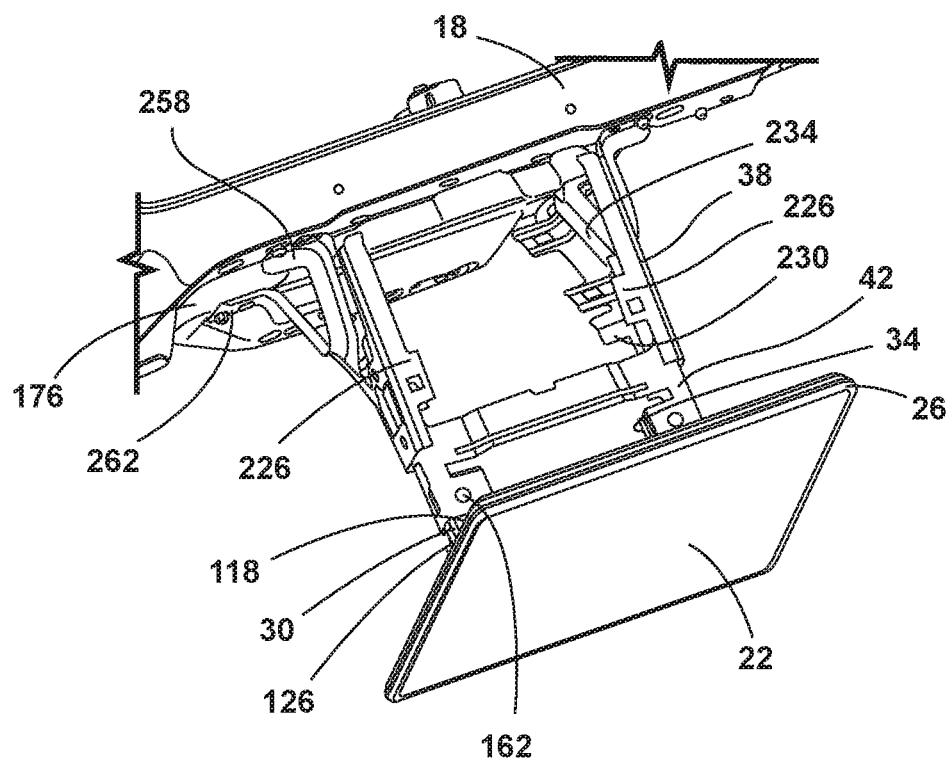
FIG. 7 is a top perspective view of the display screen mounting assembly, according to one example.

Referring now to FIG. 7, an exemplary configuration of the first and second brackets 38, 42 is shown for supporting the display screen 22. The first bracket 38 is coupled to the cross-car beam 18, and the first bracket 38 is coupled to the second bracket 42 at an opposing end portion. The second bracket 42 is coupled to the first and second protrusions 30, 34 of the housing 26. The second bracket 42 may be positioned between an upper flange 226 and a lower flange 230 defined by opposing interior surfaces 234 of the first bracket 38.

Figure 8:
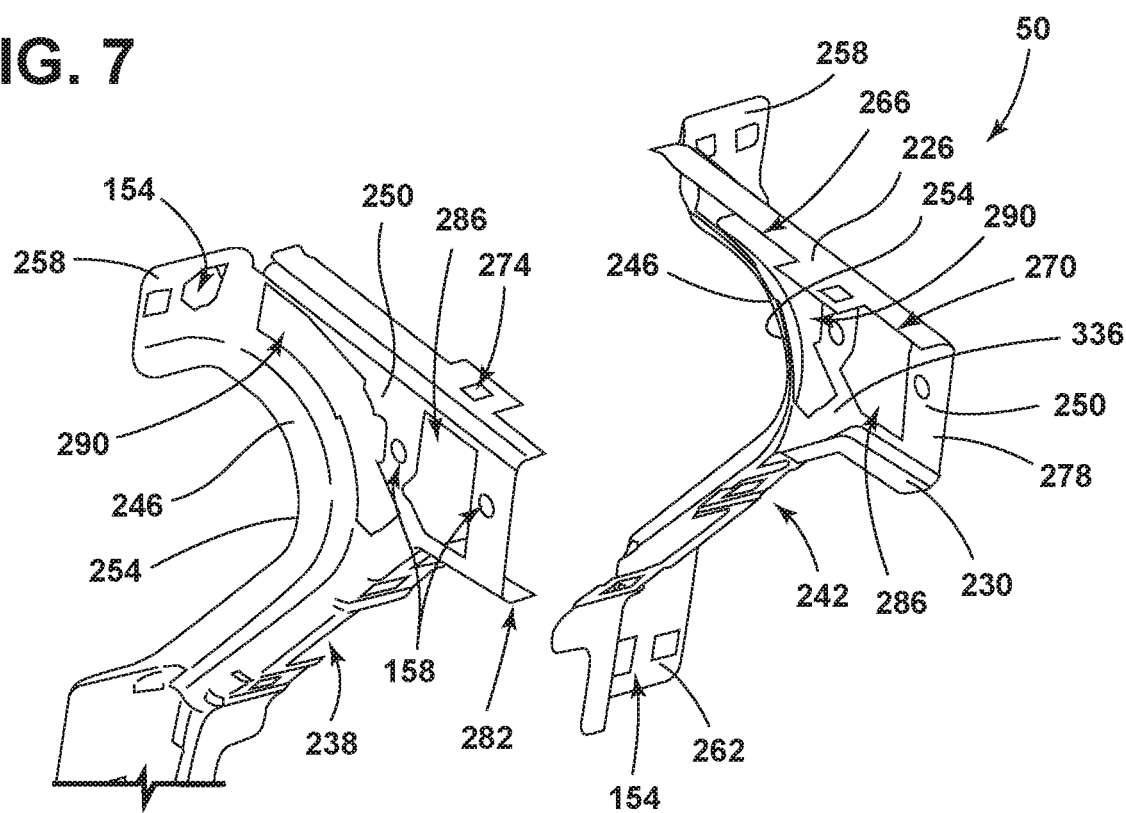
FIG. 8 is a side perspective view of the first bracket having left and right first bracket members, according to one example.

Referring to FIGS. 7 and 8, the first bracket 38 includes left and right first bracket members 238, 242, which are coupled to the cross-car beam 18. The left and right first bracket members 238, 242 include arcuate support portions 246 and horizontal support portions 250, respectively. The arcuate support portions 246 form arced interior edges 254 between upper attachment tabs 258 and lower attachment tabs 262. The upper attachment tabs 258 extend outwards from the left and right first bracket members 238, 242. The lower attachment tabs 262 extend downwards from the left and right first bracket members 238, 242. The upper and lower attachment tabs 262 each define mounting holes 158 for retaining the first bracket 38 to the cross-car beam 18. In the depicted example, the upper and lower attachment tabs 258, 262 are both coupled to the side surface 176 of the cross-car beam 18, such as, for example, a vehicle-rearward surface of the cross-car beam 18.

In various examples, the horizontal support portions 250 of the left and right first bracket members 238, 242 extend from proximate to the upper attachment tabs 258 in a vehicle-rearward direction. The horizontal support portions 250 include the upper flanges 226 and the lower flanges 230 extending inwards towards the opposing bracket member. As illustrated, the upper flanges 226 each define a first notch 266 and a second notch 270 (e.g., proximate to the second bracket 42). The first notch 266 is positioned in a more vehicle-rearward direction on the left and right first bracket members 238, 242 compared to the second notch 270. In various examples, the first notches 266 may have a length in a range of from about 20 mm to about 30 mm and a width in a range of from about 2 mm to about 10 mm, according to one example. The second notches 270 may have a length in a range of from about 70 mm to about 80 mm and a width in a range of from about 2 mm to about 10 mm, according to one example. The first and second notches 266, 270 may be separated by the upper flange 226 which has a greater width compared to the first and second notches 266, 270. The upper flange 226 may also define an interior opening 274 positioned between the first and second notches 266, 270. As illustrated, the interior opening 274 is shaped as a square, but may be circular, oval, triangular, square, rectangular, or another higher order polygonal shape.

Still referring to FIG. 8, the upper and lower flanges 226, 230 are coupled via sidewalls 278 of the left and right first bracket members 238, 242, respectively. The upper and lower flanges 226, 230 with the sidewalls 278 form a c-section 282 in each of the left and right bracket members 238, 242. The c-section 282 may have a height in a range of from about 40 mm to about 60 mm, according to one example. The sidewalls 278 may each define mounting holes 158 for coupling the left and right first bracket members 238, 242 of the first bracket 38 to the second bracket 42. As illustrated, the horizontal support portions 250 each define two mounting holes 158 positioned at a substantially similar height. The horizontal support portions 250 of the left and right first bracket members 238, 242 define slots, such as for example, elongated slots 286 positioned between the mounting holes 158. The elongated slots 286 are illustrated being substantially rectangular, but it is contemplated that the slots may be circular, oval, triangular, square, rectangular, or another higher order polygonal shape. The elongated slot 286 may have a length in a range of from about 30 mm to about 50 mm, and a width in a range of from about 20 mm to about 30 mm, according to a specific example. The left and right first bracket members 238, 242 may also define arcuate slots 290 positioned in a more vehicle-forward direction compared to the elongated slots 286. The shape of the arcuate slots 290 may substantially mirror the arced shape of the arcuate slots 290 of the left and right first bracket members 238, 242. The arcuate slots 290 may have a width in a range of from about 10 mm to about 25 mm, and a length along the arc in a range of from about 75 mm to about 95 mm, according to one example. The combination of the first and second notches 266, 270, the elongated slots 286, and the arcuate slots 290 may be advantageous to manage input forces of different load scenarios acting on the display screen 22 (FIG. 1) and/or display screen mounting assembly 50.

Figure 9:
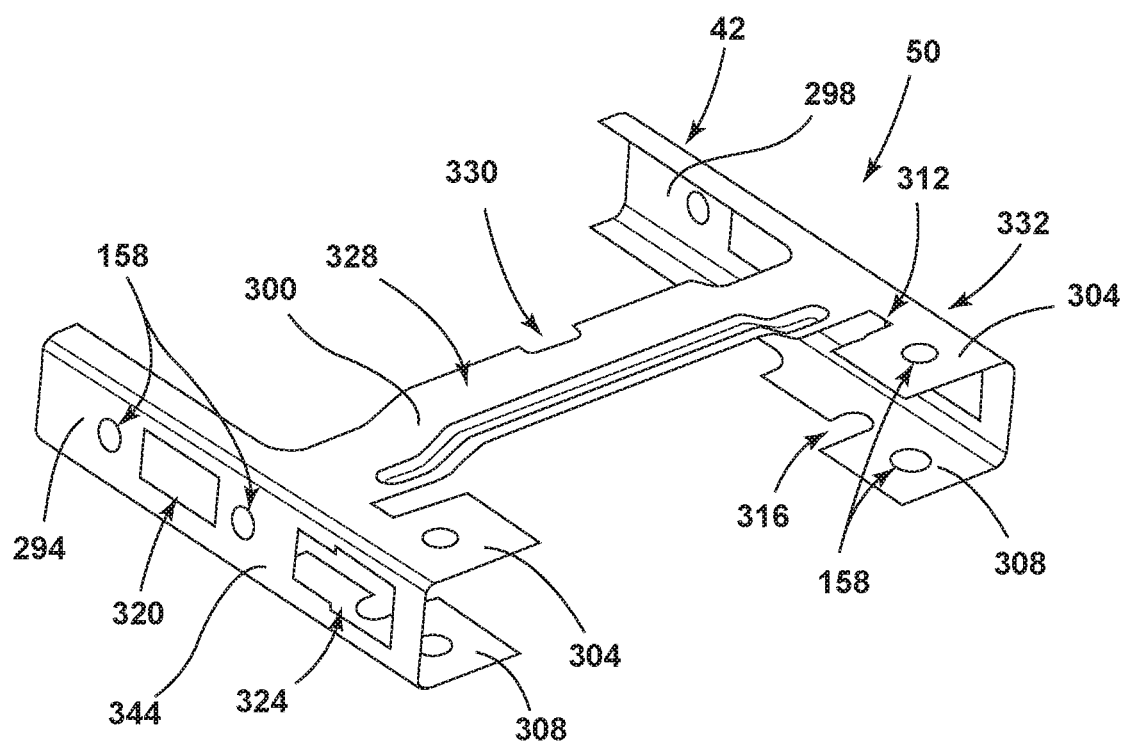
FIG. 9 is a side perspective view of the second bracket of the display screen mounting assembly, according to one example.

Referring now to FIG. 9, the second bracket 42 includes first and second lateral supports 294, 298 and a connector support 300 positioned therebetween such that the second bracket 42 may be substantially H-shaped. The first and second lateral supports 294, 298 each include an upper coupling tab 304 and a lower coupling tab 308. The upper and lower coupling tabs 304, 308 each define the mounting holes 158 for coupling the second bracket 42 to the housing 26 (FIG. 2) The first and second lateral support 294, 298 may each define an upper indent 312. The upper indents 312 may be substantially square or rectangular. It is contemplated that the upper indents 312 may also be rounded. As illustrated, the upper indents 312 are defined adjacent to the upper coupling tabs 304. The upper indents 312 may have a length in a range of from about 2 mm and about 15 mm, and a width in a range of from about 10 mm to about 30 mm, according to one example. The first and second lateral supports 294, 298 may also define lower indents 316. The lower indents 316 may be substantially vertically aligned with the upper indents 312. It is also contemplated that the lower indents 316 may be offset from the upper indents 312. As depicted, the lower indents 316 are defined adjacent to the lower coupling tabs 308. The lower indents 316 may be rounded, but it is also contemplated that the lower indents 316 may be square or rectangular in shape. The lower indent 316 may have an arc length in a range of from about 5 mm to about 10 mm, according to one example.

Referring still to FIG. 9, the first and second lateral supports 294, 298 may each define first and second cutouts 320, 324. The first cutouts 320 may have a substantially rectangular shape with a length in a range of from about 30 mm to about 50 mm and a width in a range of from about 10 mm to about 20 mm, according to a specific example. The second cutouts 324 may be positioned in a more vehicle-rearward direction than the first cutouts 320 (e.g., proximate to the display screen 22). The second cutouts 324 may also be substantially rectangular in shape with a length in a range of from about 25 mm to about 40 mm and a width of from about 5 mm to about 20 mm, according to one example. The second cutouts 324 may be positioned between two mounting holes 158 configured to couple the second bracket 42 to the first bracket 38. It is contemplated that the size and/or shape of the first and second cutouts 320, 324 may differ based on the desired energy management and deformation of the display screen mounting assembly 50.

Referring now to FIGS. 7 and 9, as illustrated, the first and second lateral supports 294, 298 include upper coupling tabs 304 and lower coupling tabs 308. The upper and lower coupling tabs 308 may be configured to cooperate with the top and bottom surfaces 118, 126 of the first and second protrusions 30, 34, respectively. In other words, the upper coupling tabs 304 may abut the top surfaces 118 of the first and second protrusions 30, 34, and the lower coupling tabs 308 may abut the bottom surfaces 126 of the first and second protrusions 30, 34. The second bracket 42 also includes the connector support 300 extending between the first and second lateral supports 294, 298. The connector support 300 may include a central plateau 328, which may define a central indent 330.

Referring now to FIGS. 7-9, the fasteners 162 extend through the mounting holes 158 of the upper coupling tabs 304, the elongated apertures 82 of the first and second protrusions 30, 34, and the mounting holes 158 of the lower coupling tabs 308 to retain the second bracket 42 to the housing 26. The upper and lower indents 312, 316 may be positioned proximate where the second bracket 42 couples to the housing 26 to assist in deformation of the second bracket 42 in response to a load acting on the display screen 22. Further, when assembled, the first and second lateral supports 294, 298 extend between the upper and lower flanges 226, 230 of the first bracket 38. The horizontal supports 134 of the first bracket 38 may extend proximate to the connector support 300 of the second bracket 42. Accordingly, a vehicle-forward end portion 332 of the second bracket 42 may extend proximate to the arced interior edges 254 of the first bracket 38 (e.g., of the left and right first bracket members 238, 242). As such, an outer surface 344 of the second bracket 42 may abut an inner surface 336 of the sidewalls 278, upper flanges 226, and/or lower flanges 230 of the first bracket 38. The mounting holes 158 on the sidewalls 278 of the first bracket 38 and the first and second lateral supports 294, 298 of the second bracket 42 may align such that the mounting holes 158 may receive the fasteners 162 to couple the second bracket 42 to the first bracket 38. The first and second brackets 38, 42 may be formed from, for example, metals and metal alloys, such as steel. In various examples, the first and second brackets 38, 42 may be formed from a heat metal stamping process. The first and second brackets 38, 42 may be configured to deform in response to a pre-determined load acting on at least one of the first bracket 38, the second bracket 42, and the display screen 22. The first and second notches 266, 270, the elongated slots 286, the arcuate slots 290, the first and second cutouts 320, 324, and/or the upper and lower indents 312, 316 may be advantageous in facilitating stroking of the display screen 22 and/or assisting the first and second brackets 38, 42 deform in response to the pre-determined load.

Use of the present disclosure may provide for a variety of advantages. Conventional display attachments are typically not tunable to various load requirements. The present display screen mounting assembly 50 may be tuned to specific loads acting on the display screen 22. The first and second brackets 38, 42 may provide sufficient support to accommodate specific noise, vibration, and harshness as well as dynamic load requirements. The first and second brackets 38, 42 may also include various crush initiators (e.g., arced edges 202, first and second cutouts 320, 324, etc.) that allow the interface between the housing 26 and the first and/or second brackets 38, 42 to be sufficiently compliant to allow the display screen 22 to stroke in response to a dynamic event.

According to various examples, a vehicle instrument panel assembly includes a display screen positioned within a housing, wherein the housing includes first and second protrusions. The vehicle instrument panel assembly includes a cross-car beam and a first bracket coupled to the cross-car beam. A second bracket is coupled to the first bracket and the first and second protrusions of the housing. Embodiments of the present disclosure may include one or a combination of the following features:

the second bracket is coupled to the cross-car beam;
the second bracket is coupled to a lower surface of the first bracket;
the second bracket is coupled to a vehicle-rearward portion of the first bracket;
the first bracket includes left and right first bracket members coupled to the cross-car beam;
the first and second protrusions each define an elongated aperture;
the first bracket includes a center attachment tab configured to couple to an upper surface of a cross-car beam and lateral attachment tabs configured to couple to a side surface of the cross-car beam;
a body of the first bracket defines an arced edge between the center attachment tab and each of the lateral attachment tabs;
the second bracket includes a horizontal support configured to abut the bottom surfaces of the first and second protrusions, respectively;
fasteners positioned within elongated apertures defined by the first and second protrusions, respectively;
the first bracket includes left and right elongated supports configured to abut the top surfaces of the first and second protrusions, respectively;
the left and right elongated supports include v-shaped portions and horizontal portions, respectively;
the horizontal portions define v-shaped scores proximate to the v-shaped portions;
the left and right first bracket members include horizontal support portions and arcuate support portions, respectively;
the horizontal support portions of the left and right first bracket members define cutouts;
the second bracket includes left and right lateral supports and a connector support therebetween;
the left and right lateral supports each include upper and lower coupling tabs configured to cooperate with top and bottom surfaces of the first and second protrusions; and the first and second brackets are configured to deform in response to a pre-determined load acting on at least one of the first and second brackets.

Modifications of the disclosure will occur to those skilled in the art and to those who make or use the disclosure. Therefore, it is understood that the embodiments shown in the drawings and described above are merely for illustrative purposes and not intended to limit the scope of the disclosure, which is defined by the following claims, as interpreted according to the principles of patent law, including the doctrine of equivalents.

It is to be understood that variations and modifications can be made on the aforementioned structure without departing from the concepts of the present disclosure, and further it is to be understood that such concepts are intended to be covered by the following claims unless these claims by their language expressly state otherwise.

What is claimed is:

1. A vehicle instrument panel assembly, comprising:
   a display screen positioned within a housing, wherein the housing includes first and second protrusions;
   a cross-car beam;
   a first bracket coupled to the cross-car beam; and
   a second bracket coupled to the first bracket and the first and second protrusions of the housing, wherein the second bracket includes first and second lateral supports each including an upper coupling tab and a lower coupling tab configured to cooperate with top and bottom surfaces of the first and second protrusions.

2. The vehicle instrument panel assembly of claim 1, wherein the second bracket is coupled to a vehicle-rearward portion of the first bracket.

3. The vehicle instrument panel assembly of claim 2, wherein the first bracket includes left and right first bracket members coupled to the cross-car beam.

4. The vehicle instrument panel assembly of claim 1, wherein the first and second protrusions each define an elongated aperture.

5. A display screen mounting assembly for a vehicle, comprising:
   a display screen positioned within a housing, wherein the housing includes first and second protrusions;
   a first bracket having left and right first bracket members, wherein the left and right first bracket members are configured to be coupled to a cross-car beam; and
   a second bracket coupled to the first bracket and the first and second protrusions, wherein the second bracket includes a connector support extending between left and right lateral supports, and wherein each of the left and right lateral supports includes upper and lower coupling tabs configured to cooperate with top and bottom surfaces of the first and second protrusions.

6. The display screen mounting assembly of claim 5, wherein the left and right first bracket members include horizontal support portions and arcuate support portions, respectively.

7. The display screen mounting assembly of claim 6, wherein the horizontal support portions of the left and right first bracket members define cutouts.

8. The display screen mounting assembly of claim 5, wherein the first and second brackets are configured to deform in response to a pre-determined load acting on at least one of the first and second brackets.

9. The vehicle instrument panel assembly of claim 1, wherein the first bracket includes left and right bracket members each having an arcuate support portion and a horizontal support portion, wherein the arcuate support portions are coupled to the cross-car beam and the horizontal support portions are coupled to the second bracket.

10. The vehicle instrument panel assembly 9, wherein the left and right bracket members each define an elongated slot and an arcuate slot.

11. The vehicle instrument panel assembly of claim 1, wherein the first and second lateral supports each define an upper indent adjacent to the upper coupling tab and a lower indent adjacent to the lower coupling tab.

12. The vehicle instrument panel assembly of claim 1, wherein the second bracket includes a connector support extending between the first and second lateral supports.

13. The vehicle instrument panel assembly of claim 12, further comprising:
    fasteners, wherein the fasteners extend through mounting holes defined in the upper coupling tabs, elongated apertures defined by the first and second protrusions of the housing, and mounting holes defined in the lower coupling tabs, respectively.

14. The vehicle instrument panel assembly of claim 1, wherein the first and second brackets are configured to deform in response to a pre-determined load acting on at least one of the first and second brackets.

15. The display screen mounting assembly of claim 5, wherein each of the left and right lateral supports includes a sidewall defining cutouts, wherein at least one of the cutouts is defined between two mounting holes for coupling the left and right lateral supports to the first bracket.

16. The display screen mounting assembly of claim 15, further comprising:
    fasteners, wherein the fasteners extend through mounting holes defined in the first bracket and the mounting holes defined in the left and right lateral supports to couple the second bracket to the first bracket.

17. The display screen mounting assembly of claim 5, wherein an outer surface of the second bracket abuts an inner surface of the first bracket.

18. The display screen mounting assembly of claim 5, wherein the connecting support is coupled to each of the left and right lateral supports proximate the upper coupling tabs.

* * * * *